United States Patent
Wang (10) Patent No.: US 11,269,010 B2
(45) Date of Patent: Mar. 8, 2022

(54) METHOD FOR DETECTING A MALFUNCTION STATE OF AN ELECTRIC MACHINE

(71) Applicant: Robert Bosch GmbH, Stuttgart (DE)

(72) Inventor: Yi Wang, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/637,944

(22) PCT Filed: Jul. 13, 2018

(86) PCT No.: PCT/EP2018/069088
§ 371 (c)(1),
(2) Date: Feb. 10, 2020

(87) PCT Pub. No.: WO2019/034343
PCT Pub. Date: Feb. 21, 2019

(65) Prior Publication Data
US 2020/0200823 A1    Jun. 25, 2020

(30) Foreign Application Priority Data

Aug. 17, 2017   (DE) .......................... 102017214363.0

(51) Int. Cl.
*G01R 31/34* (2020.01)
*G01R 31/00* (2006.01)

(52) U.S. Cl.
CPC ......... *G01R 31/343* (2013.01); *G01R 31/007* (2013.01)

(58) Field of Classification Search
CPC .... G01R 31/343; G01R 31/007; G01R 31/42; G01R 23/16; G01R 31/006; G01R 31/50; G01R 31/346
See application file for complete search history.

(56) References Cited

U.S. PATENT DOCUMENTS

| 5,686,819 A * | 11/1997 | Iwatani | ................. H02J 7/1438 322/25 |
| 2009/0033357 A1* | 2/2009 | Lindsey | ............... G01R 31/346 324/765.01 |

(Continued)

FOREIGN PATENT DOCUMENTS

| DE | 2551683 A1 * | 6/1977 | ............. G01R 23/16 |
| EP | 2551685 A1 | 1/2013 | |

(Continued)

OTHER PUBLICATIONS

S. Cheng and T. G. Habetler, "Using Only the DC Current Information to Detect Stator Turn Faults in Automotive Claw-Pole Generators," in IEEE Transactions on Industrial Electronics, vol. 60, No. 8, pp. 3462-3471, Aug. 2013 (Year: 2013).*

(Continued)

*Primary Examiner* — Daniel R Miller
(74) *Attorney, Agent, or Firm* — Norton Rose Fulbright US LLP; Gerard Messina (57) ABSTRACT

A method is described for detecting a malfunction stage of an electric machine including a rotor, a stator and a rectifier circuit connected to the stator. A temporal progress of a voltage value of the electric machine is recorded. An evaluation value is determined from the recorded temporal progress of the voltage value. The determined evaluation value is compared to a reference value, and it being evaluated as a function of a result of this comparison whether or not a malfunction state of the electric machine is present.

14 Claims, 8 Drawing Sheets

(56) References Cited

U.S. PATENT DOCUMENTS

| | | | | |
|---|---|---|---|---|
| 2009/0167256 A1* | 7/2009 | Maddali | ............... | H02P 9/10 |
| | | | | 322/25 |
| 2009/0218992 A1* | 9/2009 | Nagata | ............... | H02P 9/006 |
| | | | | 322/99 |
| 2014/0197842 A1* | 7/2014 | Mehringer | ......... | G01R 31/343 |
| | | | | 324/503 |
| 2016/0266206 A1* | 9/2016 | Thompson | ........... | G01R 31/50 |

FOREIGN PATENT DOCUMENTS

| | | |
|---|---|---|
| GB | 2122749 A | 1/1984 |
| WO | 2005085792 A1 | 9/2005 |
| WO | 2017129285 A1 | 8/2017 |

OTHER PUBLICATIONS

International Search Report for PCT/EP2018/069088, dated Nov. 14, 2018.

* cited by examiner

METHOD FOR DETECTING A MALFUNCTION STATE OF AN ELECTRIC MACHINE

FIELD

The present invention relates to a method for detecting a malfunction state of an electric machine and to a processing unit and a computer program for carrying out the method.

BACKGROUND INFORMATION

Different types of current generators may be used to supply networks or load current circuits. For example, a multiphase current may be generated with the aid of three-phase current generators. Converters operated as rectifiers may be used to feed direct current systems from such three-phase current generators in order to convert a multi-phase current generated by the three-phase current sources into direct current. The rectification may take place with the aid of passive (diodes) or active (semiconductor switches) rectifier elements. In an active rectifier, a corresponding activation circuit, in addition to the field regulator, is also part of the generator regulator. Three-phase current generators may often be implemented as electric machines, which may be operated as generators to generate electrical energy, or as motors to convert electrical energy into mechanical energy.

For example, such current generators may be used in motor vehicles to supply a motor vehicle electrical system. A corresponding electric machine may be operated as a generator, for example, to supply the motor vehicle electrical system or to charge a motor vehicle battery. For this purpose, the electric machine may be connected to the vehicle electrical system via so-called output stages or output stage circuitry.

SUMMARY

According to the present invention, an example method for detecting a malfunction state of an electric machine, and an example processing unit and an example computer program for carrying out the method, are provided. Advantageous embodiments of the present invention are described herein.

The electric machine may, in particular, be designed as a generator, e.g., as a claw pole generator, and/or, in particular, as an electric machine which may be operated as a motor or as a generator. The electric machine includes, in particular, a rotor and a stator, and a rectifier circuit connected to the stator for rectifying an AC voltage present at the stator. The rectifier circuit may, in particular, include bridge circuits made up of passive switching elements, in particular diodes, or made up of active switching elements, in particular semiconductor switches, such as metal oxide semiconductor field effect transistors (MOSFET).

The present invention provides an option for detecting different error states of the electric machine and the strength thereof in a simple manner.

Within the scope of the example method, a temporal progress of a voltage value of the electric machine is recorded, in particular of a voltage value of a DC voltage provided by the electric machine, in particular of the rectified generator voltage. An evaluation value is determined from the recorded temporal progress of the voltage value. The determined evaluation value is compared to a reference value, and it is evaluated as a function of a result of this comparison whether or not a malfunction state of the electric machine is present.

In particular, this reference value is a theoretical value describing a malfunction-free electric machine. Comparing the reference and evaluation values allows, in particular, different error states of the electric machine to be detected. In this way, in particular, only one signal is required for the error detection, namely the temporal voltage curve, which may, in particular, be metrologically recorded using a simple design and, in particular, is recorded anyhow in the course of the regular operation of the electric machine. Advantageously, thus no additional hardware is required, for example in the form of additional measuring devices.

In the case of a malfunction-free electric machine, the corresponding voltage curve has, in particular, characteristic properties. The evaluation value has a characteristic value which corresponds, in particular, to the reference value. In the case of error states of the electric machine, the properties of the voltage curve change. The properties change differently as a function of the present error state, and thus also, in particular, the evaluation value. In this way, a present error state may thus be inferred by evaluating the voltage curve or the evaluation value. In particular, the error detection is independent of a rotational speed and load of the electric machine, and a malfunction state may thus be reliably detected at any rotational speed and load.

Advantageously, a statistical value of the temporal progress of the voltage value is determined as the evaluation value. Preferably, a standard deviation and/or a variance of a recurring feature determinable from the temporal progress of the voltage value is/are determined as the evaluation value.

With a malfunction-free operation of the electric machine, the temporal voltage curve has, in particular, a characteristic, periodically recurring shape. A statistical value of the determinable recurring feature, in particular, a standard deviation or a variance, is thus, in particular, comparatively low in a malfunction-free electric machine and is advantageously used as the reference value.

In the event of a malfunction state of the electric machine, the voltage curve deviates from this characteristic shape. In the case of a malfunction state, the statistical value of the determinable recurring feature of the voltage curve, in particular, the standard deviation or the variance, is thus advantageously greater than in the malfunction-free state. In this way, a malfunction state may be inferred in a simple and reliable manner as a function of the statistical value, in particular, the standard deviation or the variance.

Since the error detection is thus based on statistics, the accuracy of the error detection is, in particular, dependent on the volume of the measuring data. The more measuring data are taken into consideration, the more accurate are the results. The volume of the measuring data preferably includes at least 90 embodiments of the determinable recurring feature, in particular, at least 100. The voltage curve is thus advantageously recorded for a duration between 90 ms and 150 ms, particularly preferably for a duration of exactly 100 ms, or at least essentially 100 ms, at a sampling rate of 10 kHz, for example.

In particular, the number of the determined embodiments of the recurring feature is dependent on the duration and an instantaneous rotational speed of the electric machine. For example, 180 embodiments of the feature may be determined at a rotational speed of 3000 rpm over a duration of 100 ms. At a rotational speed of 1800 rpm, 108 embodiments may be determined over a duration of 100 ms.

According to one particularly preferred embodiment of the present invention, positions of local extremes are determined or detected as the determinable recurring feature in the temporal progress of the voltage value, in particular, of local peaks of the voltage curve. Position shall, in particular, be understood to be their temporal position or their temporal distance from one another or their angular position or their angular distance from one another. Advantageously, the evaluation value is determined from these positions of the detected local extremes. In particular, in a malfunction-free electric machine, the temporal progress of the voltage value has a local extreme or a local peak in, in particular, the same or at least essentially the same position in every period. In particular, this local peak corresponds to a maximum value of a half wave in this application. In the case of a malfunction state, the shape of the voltage curve changes, in particular, as a function of the present error and the magnitude of the malfunction. In particular, the distribution of the local extremes or of the local peaks changes. In this way, a present malfunction state may be detected in the case of a change of the distribution of the local extremes compared to the malfunction-free case. The evaluation value thus advantageously describes the positions of the detected local extremes of the voltage curve, in particular of their distribution.

A statistical value of the positions of the detected local extremes is advantageously determined as the evaluation value, particularly preferably a standard deviation and/or a variance. In the case of a malfunction-free electric machine, the positions of the local extremes should have a normal distribution having a small standard deviation. If a malfunction state is present, the distribution of the local extremes has a larger standard deviation. The evaluation value thus advantageously describes this standard deviation, or the standard deviation itself is preferably determined as the evaluation value.

The reference value is preferably determined from a reference progress of the voltage value in the case of a malfunction-free electric machine. This reference progress may be metrologically recorded during a malfunction-free operation of the electric machine, for example in the course of a manufacturing process, or may be computationally determined in the course of a theoretical model of the electric machine and be stored, for example, in a control unit for activating the electric machine.

The reference value is preferably determined as a statistical value, particularly preferably as a standard deviation and/or a variance, of the same determinable feature, i.e., in particular, of the positions of local extremes, of the reference progress of the voltage value. Similarly to the above explanation, this reference value differs from the corresponding values in the case of a malfunctioning electric machine.

In the course of the comparison of the evaluation value and of the reference value, a threshold value comparison is preferably carried out, the reference value being advantageously used as the threshold value. It is preferably checked in the process whether the evaluation value exceeds the reference value. If the evaluation value does not exceed the reference value, it is, in particular, detected that no malfunction state of the electric machine is present. In contrast, if the evaluation value exceeds the reference value, it is, in particular, detected that a malfunction state of the electric machine is present. For example, an evaluation variance exceeding the reference variance allows a malfunction to be inferred.

According to one particularly preferred embodiment of the present invention, a deviation of the evaluation value from the reference value is determined in the course of the comparison of the evaluation value and of the reference value. A magnitude of a present malfunction is preferably evaluated as a function of this deviation.

It is advantageously evaluated as a function of the comparison result whether one or multiple of the following state(s) is/are present as a malfunction state of the electric machine:

an interruption in a phase, an increased resistance being present between a phase terminal of the stator and the rectifier circuit, in particular, a center tap of a half bridge of the rectifier circuit;

a short circuit between two phases of the electric machine, a decreased, in particular vanishing, resistance being present between two phase terminals of the stator;

an interruption in a switching element path, an increased resistance being present between two switching elements of a half bridge of the rectifier circuit;

a short circuit in a switching element path, a decreased, in particular vanishing, resistance being present across one switching element of the rectifier circuit.

In particular, the strength of these malfunction states may be evaluated as a function of the deviation of the evaluation value from the reference value. The greater the resistance value during an interruption, the more pronounced is the corresponding error state. The smaller the resistance value during a short circuit, the more pronounced is this corresponding error state.

Advantageously, a temporal progress of a voltage value of a DC voltage of the electric machine present at a rectifier circuit of the electric machine is recorded. The voltage value may, in particular, be metrologically recorded between DC voltage terminals of the electric machine or the rectifier circuit and is usually recorded for the regular operation of the electric machine anyhow.

Particularly advantageously, the present invention is suitable for the use in a motor vehicle. For example, a motor vehicle electrical system may be fed and/or a motor vehicle battery may be charged by the electric machine. A motor vehicle electrical system may be connected to DC voltage terminals of the rectifier circuit. In particular, a temporal progress of a DC voltage present between these DC voltage terminals is recorded within the scope of the method, and the evaluation value is determined from this DC voltage curve. The method for detecting a malfunction state may, for example, be carried out by a control unit of the motor vehicle. For example, the present invention is especially suitable for vehicles including functions having increased safety requirements, e.g., automated or autonomous driving, or for vehicles having long maintenance intervals, e.g., commercial vehicles.

A processing unit according to the present invention, e.g., a control unit of a motor vehicle, is configured, in particular from a programming point of view, to carry out a method according to the present invention.

The implementation of the method in the form of a computer program is also advantageous since this results in particularly low costs, in particular when an executing control unit is also used for additional tasks and is therefore present anyhow. Suitable data carriers for providing the computer program are, in particular, magnetic, optical and electrical memories, such as hard disks, flash memories, EEPROMs, DVDs, and the like. It is also possible to download a program via computer networks (Internet, Intranet, and the like).

Further advantages and embodiments of the present invention are derived from the description and the accompanying drawings.

The present invention is schematically shown based on exemplary embodiments in the figures and is described hereafter with reference to the figures.

DETAILED DESCRIPTION OF EXAMPLE EMBODIMENTS

Figure 1:
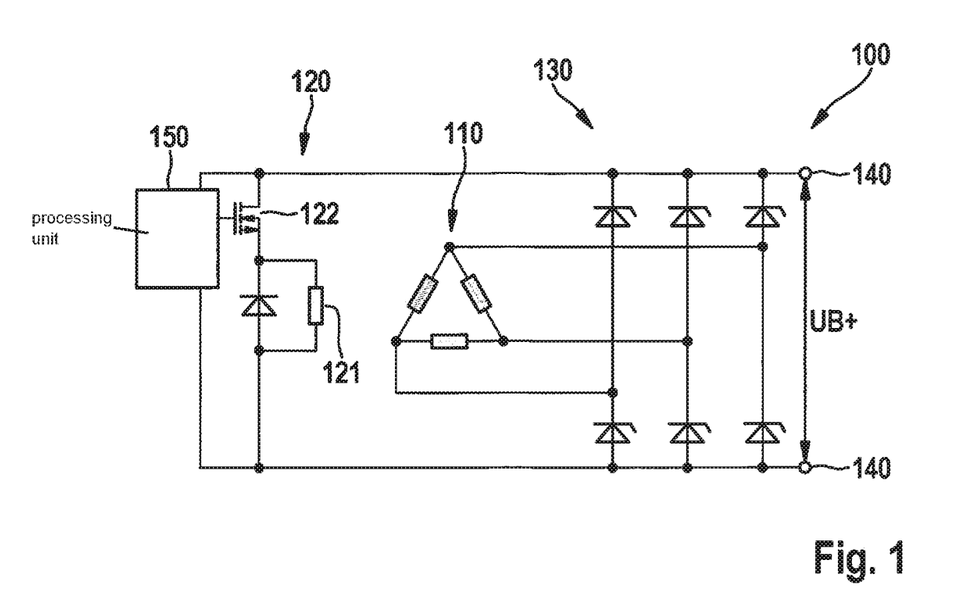
FIG. 1 schematically shows an electric machine including a preferred embodiment of a processing unit according to the present invention, which is configured to carry out a preferred specific embodiment of a method according to the present invention.

In FIG. 1, an electric machine in the form of a generator is schematically illustrated and denoted by reference numeral 100.

In this example, electric machine 100 is designed as a three-phase electric machine, stator inductances (phases) of a stator 110 being connected into a delta connection. A rotor 120 includes an excitation winding 121 including a diode connected in parallel. Furthermore, an excitation transistor 122 may be provided in an excitation circuit. A voltage (here, the rectified generator voltage) is intermittently applied to excitation winding 121 by excitation transistor 122 being switched on and off, usually with the aid of PWM operation, whereupon an excitation current arises. By varying the sampling rate of the PWM operation, in particular, the level of the excitation current, and thus the level of the generator voltage, are variable.

Electric machine 100 furthermore includes a rectifier circuit 130 which is connected to stator 110 and includes three half bridges for rectifying a three-phase AC voltage present at stator 110. Each half bridge includes a respective center tap, via which the respective half bridge is connected to a phase terminal of stator 110, between its two rectifier elements designed as diodes here.

A DC voltage UB+ is provided between two DC voltage terminals 140 of rectifier circuit 130 as a rectified generator voltage. For example in a motor vehicle, electric machine 100 may be used to supply a motor vehicle electrical system which is connected to DC voltage terminals 140.

A processing unit 150 for activating electric machine 100 is provided. For example, processing unit 150 may be designed as a control unit of the corresponding motor vehicle. Processing unit 150 is configured to carry out a detection of malfunction states of the electric machine. For this purpose, processing unit 150 is configured, in particular from a programming point of view, to carry out a preferred specific embodiment of a method according to the present invention.

Figure 2:
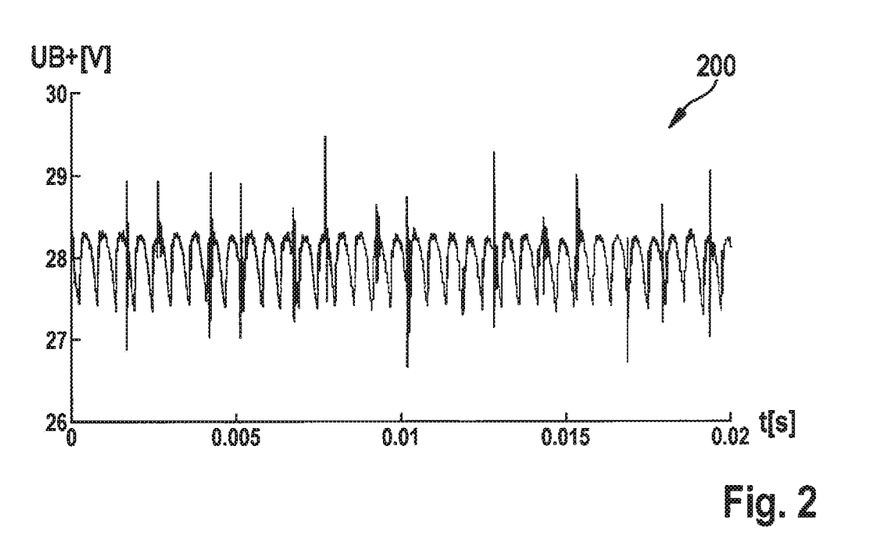
FIG. 2 schematically shows a voltage-time diagram of a temporal progress of a voltage value which may be determined in the course of a preferred specific embodiment of a method according to the present invention.

FIG. 2 schematically shows temporal progress 200 of DC voltage UB+ in the case of a malfunction-free state of electric machine 100 in a voltage-time diagram.

This voltage curve 200 represents, in particular, a reference progress of DC voltage UB+ in the error-free state of electric machine 100 and may, for example, be metrologically recorded during a malfunction-free operation of electric machine 100, for example in the course of a manufacturing process, or may be computationally determined in the course of a theoretical model of electric machine 100.

Temporal progress 200 of DC voltage UB+ has a typical shape which is, in particular, dependent on the number of phases $n_{phase}$, the number of pole pairs $n_{pol}$ and rotational speed $n_{gen}$ of electric machine 100. In particular, a period $T_{el}$ of the temporal progress of this DC voltage may be calculated as follows:

$$\frac{1}{T_{el}} = \frac{2 * n_{pol} * n_{phase} * n_{gen}}{60}$$

As is apparent from FIG. 2, in the malfunction-free state of electric machine 100, temporal progress 200 of DC voltage UB+ has a local extreme or a local peak in every period in the same or in essentially the same position. In particular, this local peak corresponds to a maximum value of a half wave in this application. At a constant rotational speed, the distance between two adjoining local extremes is ideally constant, or the extremes are always situated in the same position. Due to tolerances, measuring deviations and random interferences, the positions or distances of these local peaks (as a determinable recurring feature) should have a normal distribution having a small standard deviation (see also FIG. 9).

In the case of a malfunction state of electric machine 100, the shape of the voltage curve of DC voltage UB+ changes as a function of the present malfunction state and the magnitude of the malfunction. As a result, the distribution of the local peaks also changes. A change in the distance distribution of the local extremes compared to reference progress 200 thus indicates a malfunction state of electric machine 100.

A statistical value which depends on the instantaneous distribution of the local extremes of the voltage curve, particularly preferably the standard deviation of this distribution, is thus determined within the scope of the method to be able to detect a present malfunction state of electric machine 100.

Figure 3:
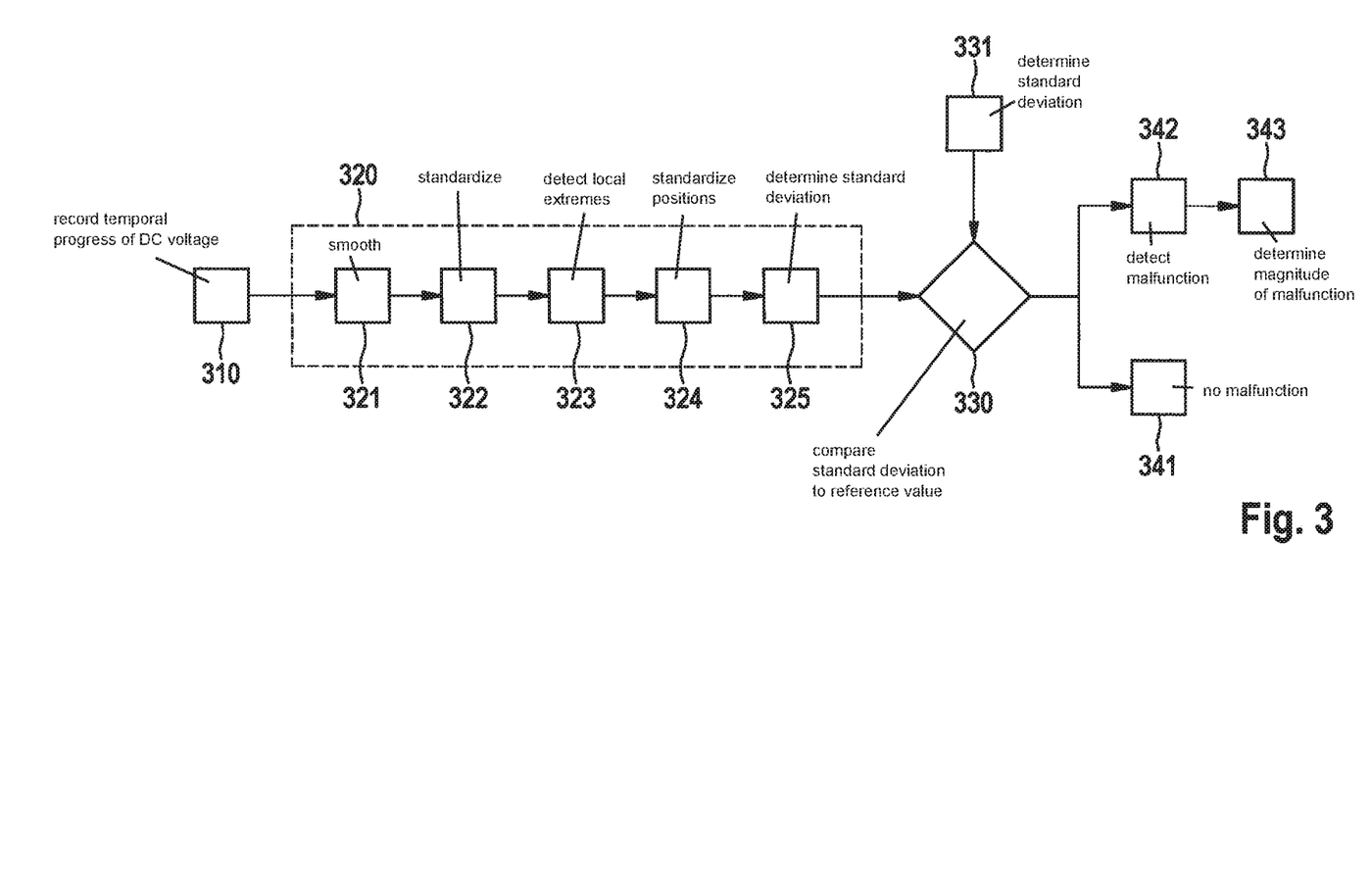
FIG. 3 schematically shows a preferred specific embodiment of a method according to the present invention as a block diagram.

A preferred embodiment of the method according to the present invention, which may advantageously be carried out by control unit 150, is schematically shown as a block diagram in FIG. 3.

During ongoing operation of electric machine 100, in step 310 the temporal progress of DC voltage UB+ is recorded for a duration of 100 ms, for example.

In step 320, an evaluation value is determined from this recorded temporal progress of DC voltage UB+. Since the raw data of the measurement may be subject to interference and noise, the raw data, i.e., the recorded temporal progress of DC voltage UB+, are initially smoothed by a filter in an optional step 321. The smoothed data are optionally standardized in step 322 with the aid of their mean value, for example by subtraction of their mean value, so that the signal curves become clearer.

Thereafter, in step 323, local extremes or local peaks are detected in the smoothed and standardized temporal progress of DC voltage UB+, and their positions within a period are determined. In particular, a theoretical value is determined for period $T_{el}$ for this purpose at the instantaneous rotational speed of electric machine 100 according to the above formula. In step 323, the local extremes are, in particular, detected with this period $T_{el}$.

To render distributions of the local peaks comparable to one another, the positions of the detected local peaks determined in step 323 are standardized in step 324 by subtraction of their mean value. In this way, a density function of the distribution of the positions of the detected local peaks is obtained, which may be assumed to be a normal distribution.

In step 325, a standard deviation of this distribution of the detected local peaks is determined as an evaluation value.

In step 330, this determined evaluation value, in the form of the standard deviation, is compared to a reference value. This reference value is determined in step 331 from a reference progress of DC voltage UB+, as it is shown in FIG. 2, for example. The reference progress at the instantaneous rotational speed of electric machine 100 may be stored with the aid of characteristic maps in control unit 150, or may be determined by control unit 150 with the aid of a theoretical model. In step 331, a standard deviation of a position distribution of local peaks of this reference progress is determined as the reference value.

In particular, a threshold value comparison is carried out in step 330, and it is checked whether the evaluation value exceeds the reference value, preferably plus a useful tolerance threshold. If the evaluation value does not exceed the reference value (if necessary, plus the tolerance threshold) and is below the reference value (if necessary, plus the tolerance threshold) (i.e., the standard deviation of the measurement is, at the most, as high as the standard deviation (if necessary, plus the tolerance threshold) of the reference), it is detected in step 341 that no malfunction state of electric machine 100 is present.

In contrast, if the evaluation value exceeds the reference value (if necessary, plus the tolerance threshold), it is detected in step 342 that a malfunction state of electric machine 100 is present. In this case, in step 343, a magnitude of the malfunction state is determined as a function of the extent to which the evaluation value deviates from the reference value (if necessary, plus the tolerance threshold). In particular, upon detection of a malfunction state in step 342, a safety or self-protection measure is carried out, for example, a limitation of the load of electric machine 100 by a limited excitation current.

Hereafter, different malfunction states of the electric machine are described with respect to FIGS. 4 through 9, and how these malfunction states may be detected within the scope of the method.

FIGS. 4 through 7 schematically show the electric machine from FIG. 1 in different malfunction states. Furthermore, FIGS. 4 through 7, similarly to FIG. 2, schematically show voltage curves of DC voltage UB+, which may be detected in these malfunction states within the scope of the method in step 310.

Figure 4A:
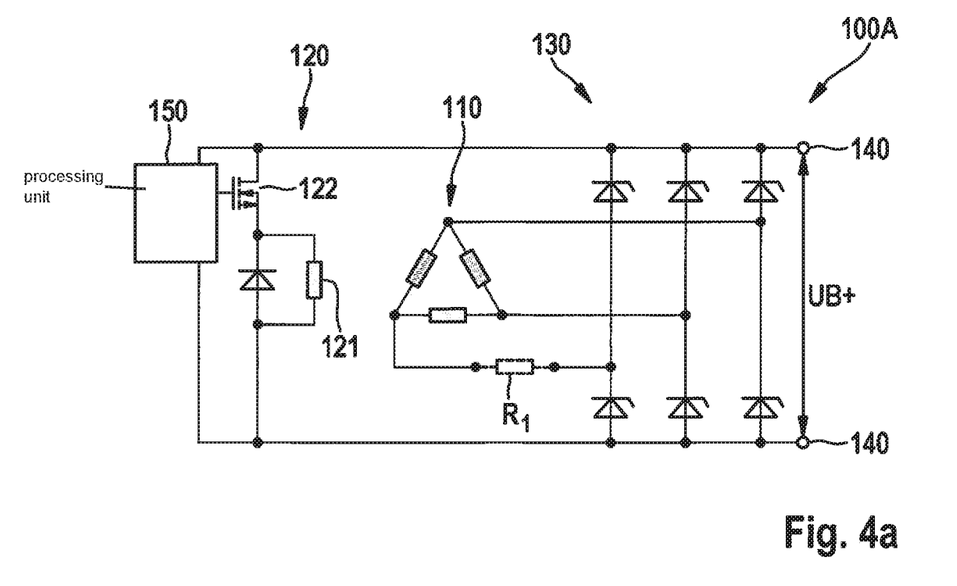
FIGS. 4 through 7 each schematically show an electric machine in a malfunction state, and each schematically show a voltage-time diagram of a temporal progress of a voltage value which may be determined in the course of a preferred specific embodiment of the method according to the present invention in the respective malfunction state of the electric machine.
Figure 4B:
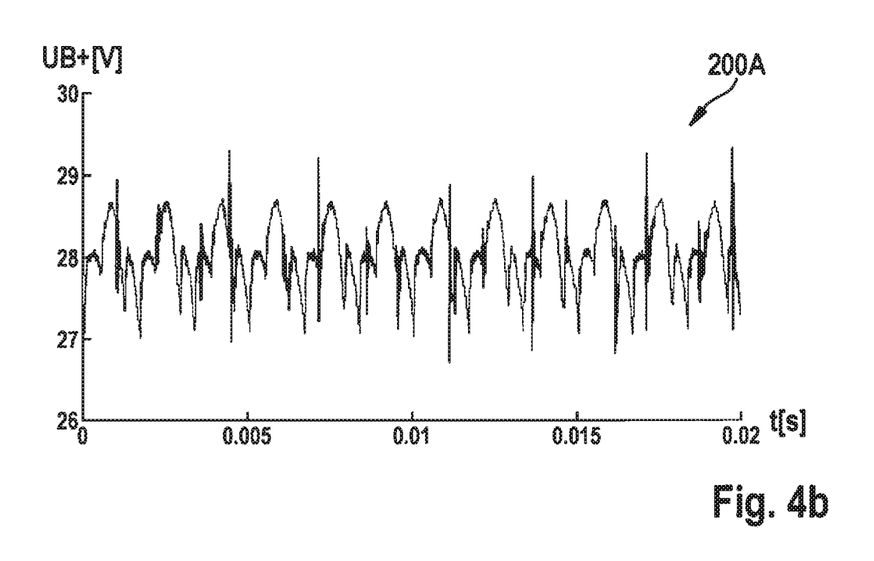

FIG. 4a schematically shows the electric machine from FIG. 1 in a first malfunction state 100A. In this malfunction state 100A, an interruption in a phase is present, an increased (possibly infinite) resistance $R_1$ being present between a phase terminal of stator 110 and a center tap of a half bridge of rectifier circuit 130. FIG. 4b shows a temporal progress 200A of DC voltage UB+ which may be detected in such a malfunction state 100A within the scope of the method in step 310.

Figure 5A:
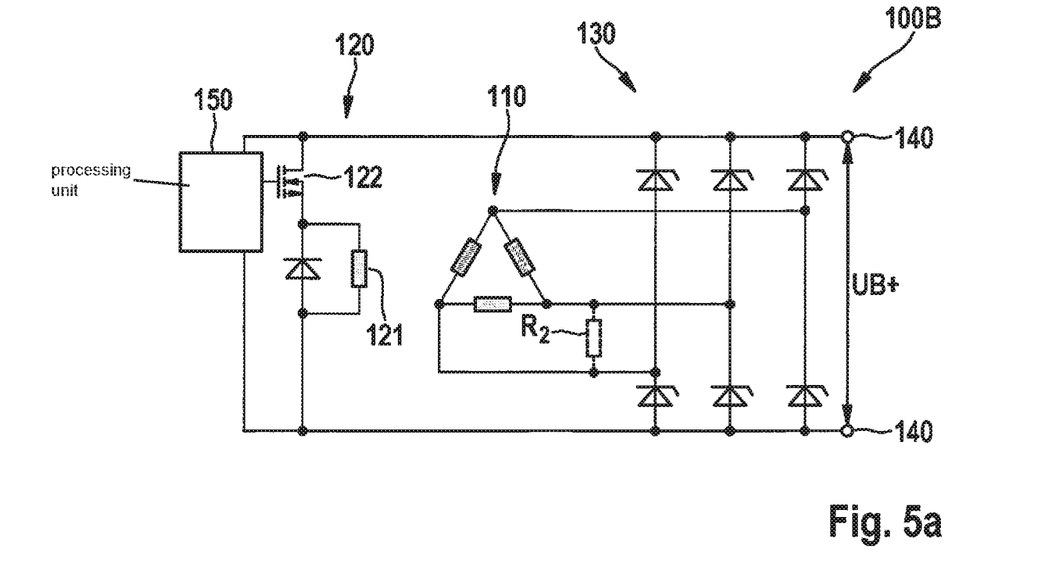
Figure 5B:
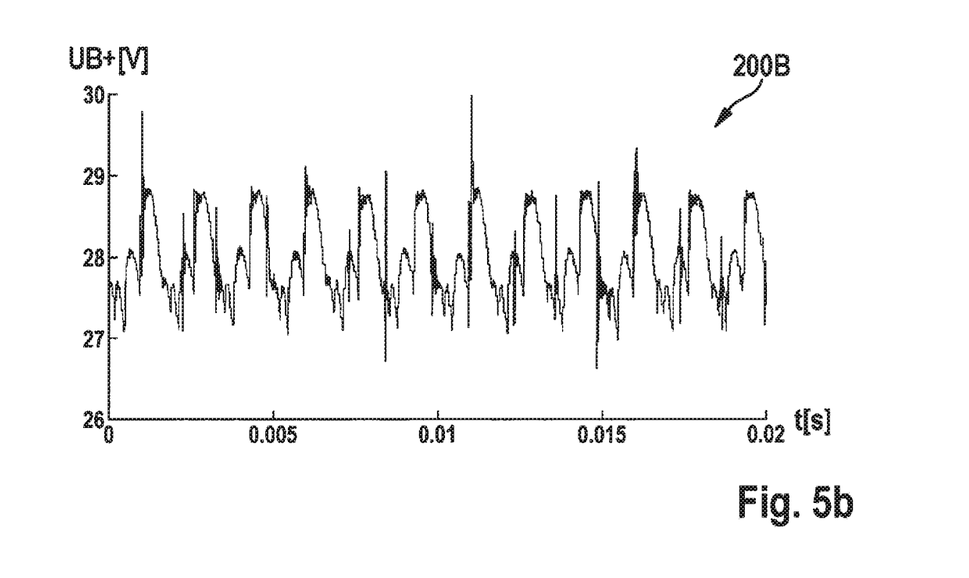

FIG. 5a schematically shows the electric machine in a second malfunction state 100B in which a short circuit is present between two phases of electric machine 100, a decreased, in particular vanishing, resistance $R_2$ being present between two phase terminals of stator 110. FIG. 5b shows a temporal progress 200B of DC voltage UB+ which may be detected in this second malfunction state 100B within the scope of the method in step 310.

Figure 6A:
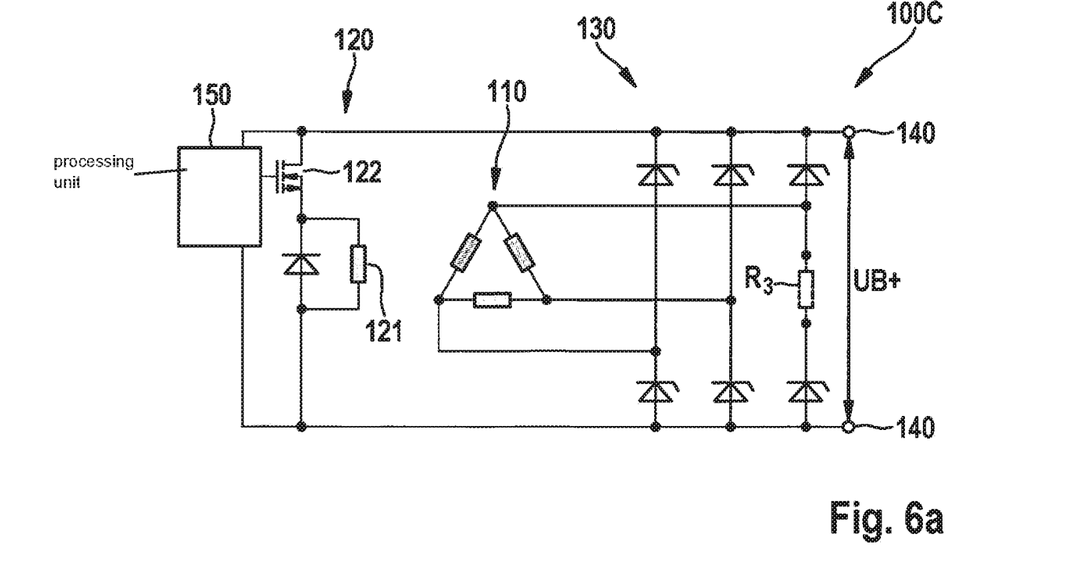
Figure 6B:
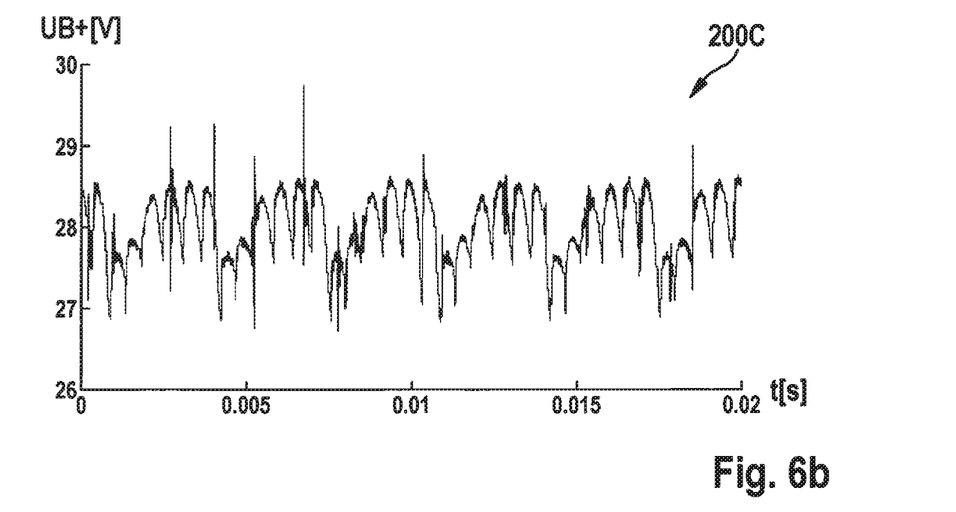

A third malfunction state 100C of the electric machine is shown in FIG. 6a, an interruption in a switching element path of rectifier circuit 130 being present. An increased (possibly infinite) resistance $R_3$ is present in the process between two switching elements of a half bridge of rectifier circuit 130. A corresponding progress 200C of DC voltage UB+ which may be detected in this third malfunction state 100C is schematically shown in FIG. 6b.

Figure 7A:
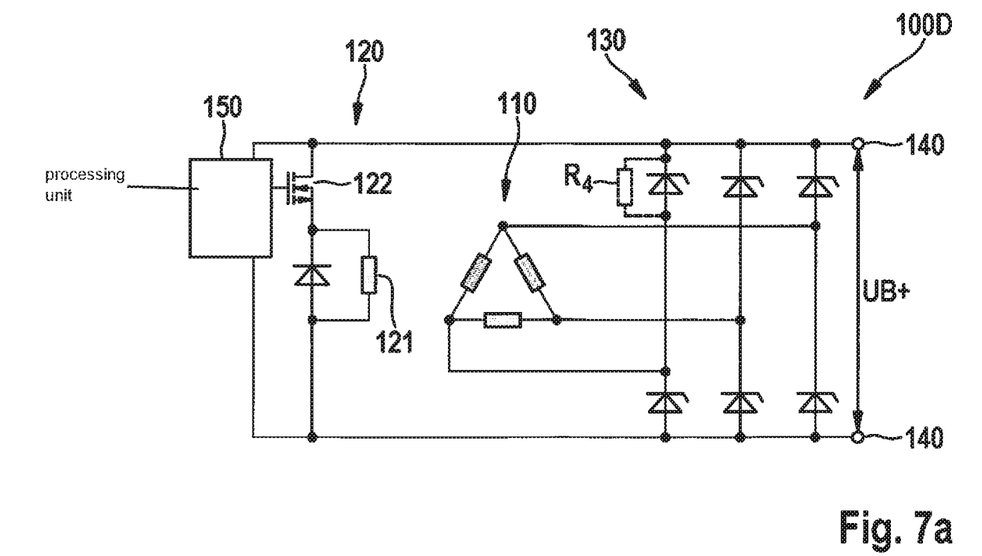
Figure 7B:
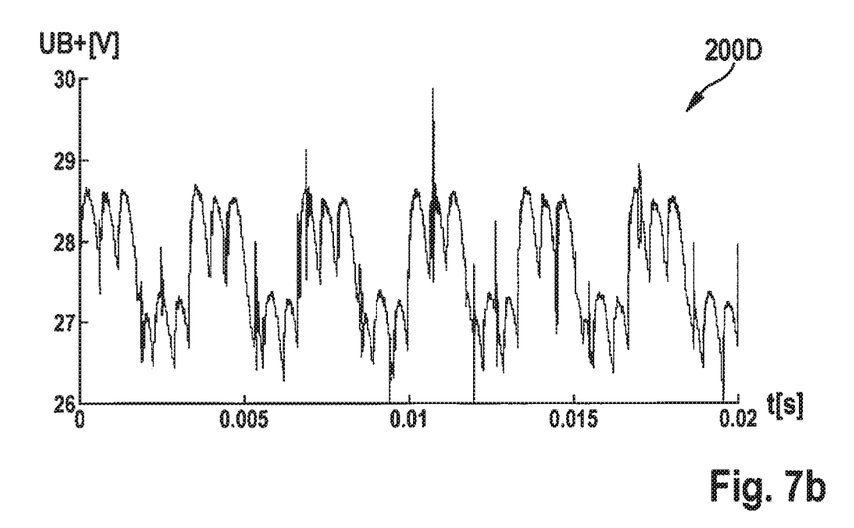

In a fourth malfunction state 100D of the electric machine, which is shown in FIG. 7a, a short circuit is present in a switching element path, with a decreased, in particular vanishing, resistance $R_4$ across a switching element of rectifier circuit 130. FIG. 7b shows a corresponding progress 200D of DC voltage UB+ which may be detected in this fourth malfunction state 100D.

Similarly to above explanations with respect to FIG. 3, these progresses 200A and 200B and 200C and 200D may be determined in step 310 of the method when the corresponding malfunction state 100A and 100B and 100C and 100D of the electric machine is present. According to steps 321 through 323, these progresses 200A and 200B and 200C and 200B are filtered and standardized to detect local peaks with the aid of period $T_{el}$.

FIG. 8 schematically shows corresponding filtered, standardized temporal progresses 200A and 200B and 200C and 200D in voltage-time diagrams, which are determined in the course of preferred specific embodiments of the method according to the present invention. The individual detected local extremes or local peaks are each represented with an asterisk.

Figure 8A:
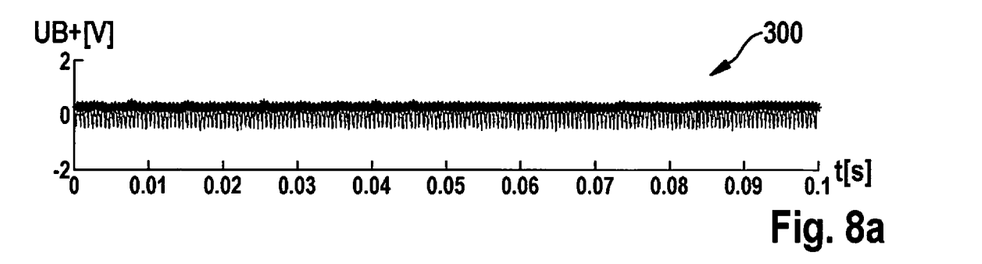
FIG. 8 schematically shows voltage-time diagrams of filtered, standardized temporal progresses of voltage values which may be determined in the course of preferred specific embodiments of the method according to the present invention.

FIG. 8a shows a filtered and standardized temporal progress 300 of reference progress 200 shown in FIG. 2.

Figure 8B:
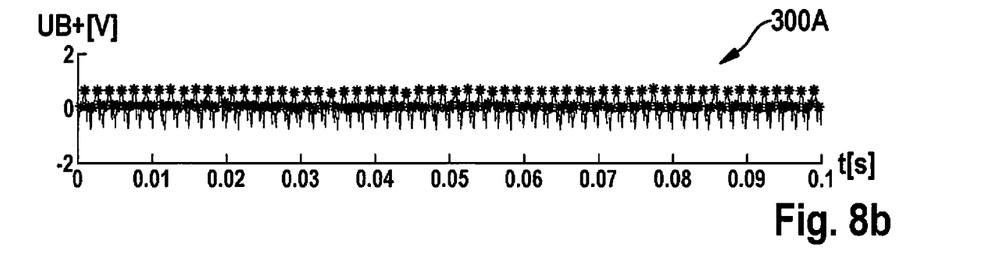

FIG. 8b shows a filtered and standardized temporal progress 300A of voltage curve 200A from FIG. 4b, which may be determined in the course of first error state 100A.

Figure 8C:
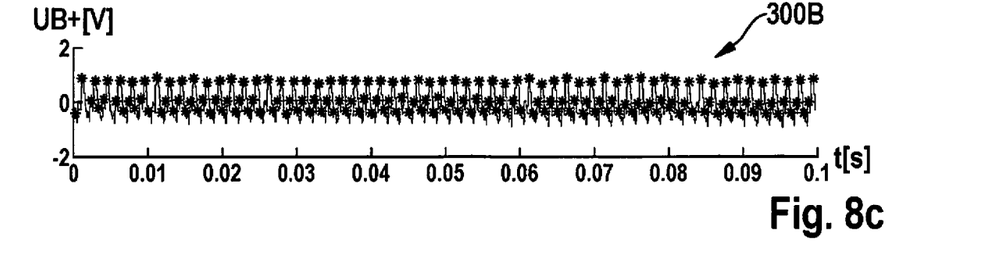

FIG. 8c shows a filtered and standardized temporal progress 300B of voltage curve 200B shown in FIG. 5b, which may be determined in the course of second error state 100B.

Figure 8D:
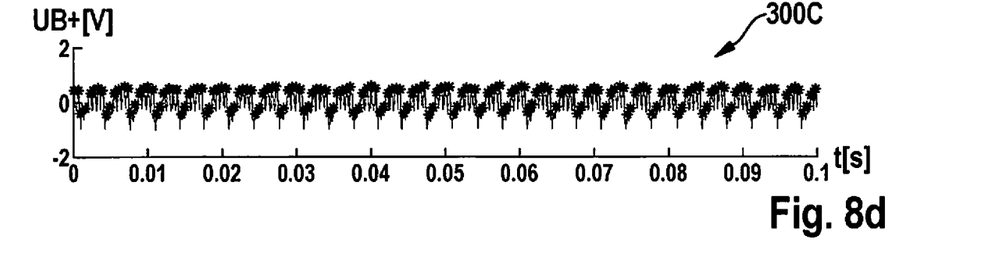

A filtered, standardized progress 300C of voltage curve 200C of third malfunction state 100C shown in FIG. 8b is represented in FIG. 8d.

Figure 8E:
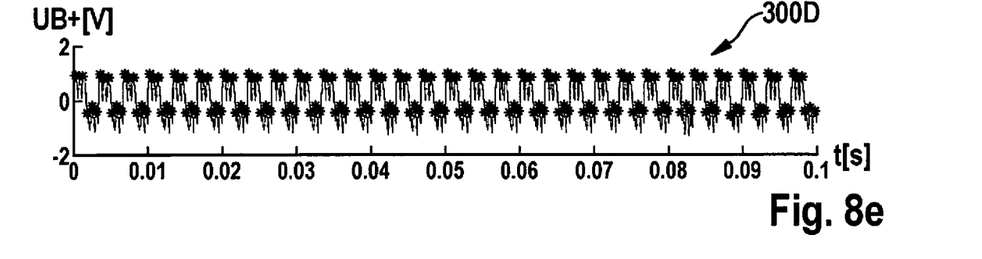

FIG. 8e represents a filtered, standardized progress 300D of voltage curve 200D shown in FIG. 7b in fourth error state 100D.

As explained above, the positions of the local peaks detected in step 323 are standardized in step 324 by subtraction of their mean value, whereby a density function of the position distribution of the detected local peaks is determined, which may be assumed to be a normal distribution, in particular, having a mean value of zero.

Figure 9:
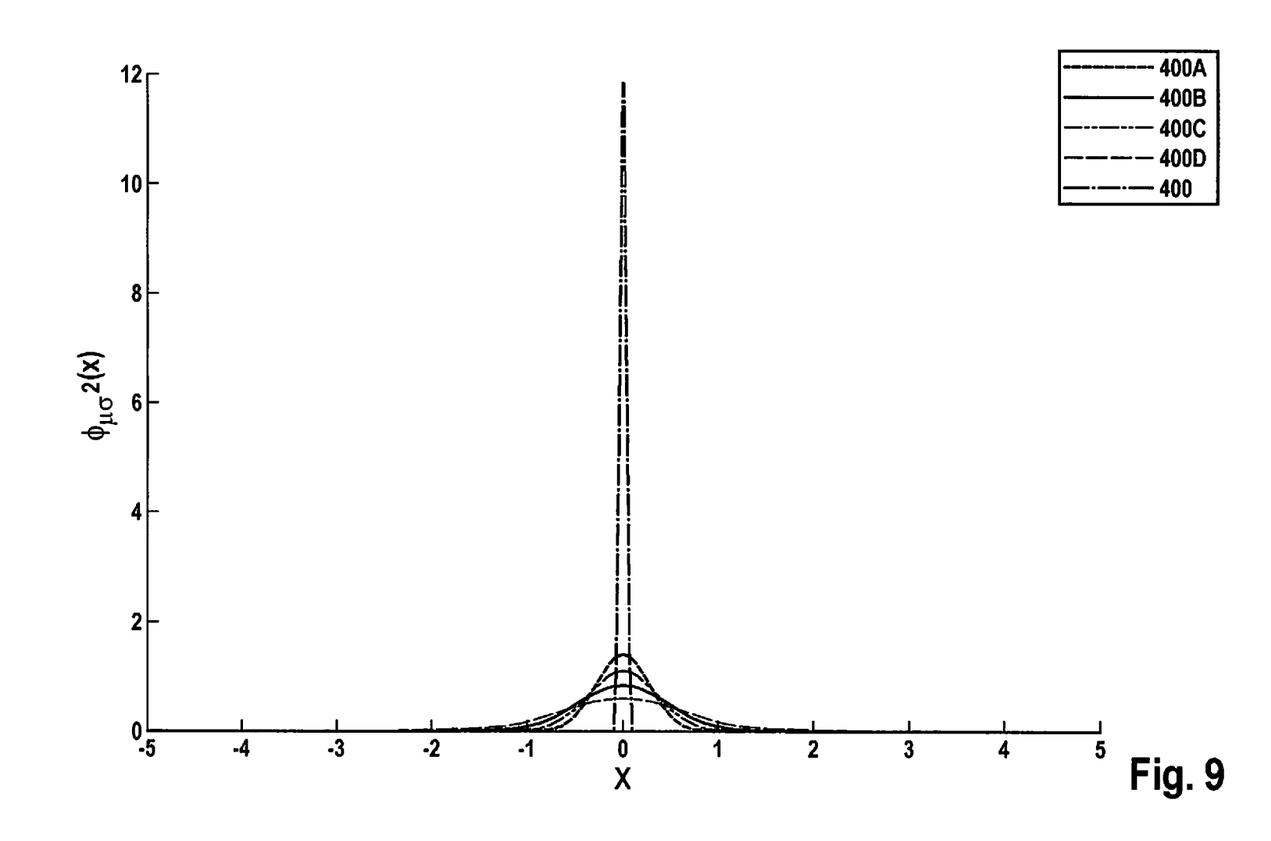
FIG. 9 schematically shows normal distributions of positions of local extremes of filtered, standardized temporal progresses of voltage values which may be determined in the course of preferred specific embodiments of the method according to the present invention.

FIG. 9 shows corresponding normal distributions of the peak positions which were detected in the filtered, standardized temporal progresses 300, 300A, 300B, 300C, 300D of FIGS. 8a through 8e.

Curve 400 is a normal distribution of the detected local peaks of the filtered, standardized progress 300 of reference progress 200 from FIG. 2 shown in FIG. 8a.

Curve 400A is a normal distribution of the positions of the detected local peaks of the filtered, standardized progress 300A from FIG. 8b in first malfunction state 100A.

Curve 400B is a normal distribution of the positions of the detected local peaks of the filtered, standardized progress 300B shown in FIG. 8c in second malfunction state 100B.

Curve 400C is a normal distribution of the positions of the detected local peaks of the filtered, standardized progress 300C shown in FIG. 8d in third malfunction state 100C.

Curve 400D is a normal distribution of the positions of the detected local peaks of the filtered, standardized progress 300D shown in FIG. 8e in fourth malfunction state 100D.

As is apparent from FIG. 9, distribution 400 of the local peaks in the reference case is the slimmest and has the lowest standard deviation or lowest variance. The standard deviation of this distribution 400 is thus determined as the reference value. The standard deviations of the remaining distributions 400A, 400B, 400C, 400D are each greater than the standard deviation of distribution 400.

The more the standard deviations of distributions 400A, 400B, 400C, 400D as evaluation values deviate from the standard deviation of distribution 400 as the reference case, the stronger is the corresponding malfunction state of the electric machine, whereby the magnitude of the respective error may be determined in step 343.

The greater resistance value $R_1$ or $R_3$ during an interruption in the first or third error state, the more pronounced is the corresponding malfunction state. The smaller resistance value $R_2$ or $R_4$ during a short circuit in the second or fourth malfunction state, the stronger is this corresponding malfunction state.

What is claimed is:

1. A method for detecting a malfunction state of an electric machine, the electric machine including a rotor, a stator, and a rectifier circuit connected to the stator, the method comprising the following steps:
    recording a temporal progress of a voltage value of the electric machine;
    determining an evaluation value, wherein:
        the determination of the evaluation value is from a combination of a plurality of values of the recorded temporal progress of the voltage value over time; and/or
        the evaluation value characterizes the recorded temporal progress of the voltage value over time;
    comparing the determined evaluation value to a value of a predefined reference constant, wherein the value of the predefined reference constant is predefined and independent of the recorded temporal progress of the voltage value; and
    evaluating, as a function of a comparison result of the comparing, whether or not a malfunction state of the electric machine is present;
    wherein positions of local extremes are determined in the temporal progress of the voltage value as determinable recurring features, and the evaluation value is determined from the determined positions of the local extremes.

2. The method as recited in claim 1, wherein a statistical value of the temporal progress of the voltage value is determined as the evaluation value.

3. The method as recited in claim 2, wherein a standard deviation and/or a variance of a recurring feature determinable from the temporal progress of the voltage value are determined as the evaluation value.

4. The method as recited in claim 1, wherein a threshold value comparison is carried out in the course of the comparison of the evaluation value and of the value of the reference constant, and it is checked whether the evaluation value exceeds the value of the reference constant.

5. The method as recited in claim 1, wherein a deviation of the evaluation value from the value of the reference constant is determined in the course of the comparison of the evaluation value and of the value of the reference constant, and a strength of a present error is evaluated as a function of the deviation.

6. The method as recited in claim 1, wherein it is evaluated as a function of the comparison result whether an interruption in a phase and/or a short circuit between two phases and/or an interruption in a switching element path and/or a short circuit in a switching element path, is present as a malfunction state of the electric machine.

7. The method as recited in claim 1, wherein a temporal progress of a voltage value of a DC voltage present at the rectifier circuit of the electric machine is recorded.

8. The method as recited in claim 1, wherein the determination of the evaluation value is from the combination of the plurality of values of the recorded temporal progress of the voltage value over time.

9. The method as recited in claim 1, wherein the evaluation value characterizes the recorded temporal progress of the voltage value over time.

10. A method for detecting a malfunction state of an electric machine, the electric machine including a rotor, a stator, and a rectifier circuit connected to the stator, the method comprising the following steps:
    recording a temporal progress of a voltage value of the electric machine, wherein positions of local extremes are determined in the temporal progress of the voltage value as determinable recurring features, and the evaluation value is determined from the determined positions of the local extremes;
    determining a statistical value of the determined positions of the local extremes as an evaluation value;
    comparing the determined evaluation value to a reference value; and
    evaluating, as a function of a comparison result of the comparing, whether or not a malfunction state of the electric machine is present.

11. The method as recited in claim 10, wherein a standard deviation and/or a variance of the determined positions of the local extremes is determined as the evaluation value.

12. A method for detecting a malfunction state of an electric machine, the electric machine including a rotor, a stator, and a rectifier circuit connected to the stator, the method comprising the following steps:
    recording a temporal progress of a voltage value of the electric machine;
    determining an evaluation value from the recorded temporal progress of the voltage value;
    comparing the determined evaluation value to a value of a reference constant, wherein the value of the reference constant is predefined, is independent of the recorded temporal progress of the voltage value, and is determined from a reference progress of the voltage value in the case of a malfunction-free electric machine, wherein the value of the reference constant is determined as a standard deviation and/or variance of position of local extremes of the reference progress of the voltage value; and evaluating, as a function of a comparison result of the comparing, whether or not a malfunction state of the electric machine is present.

13. A processing unit configured to detect a malfunction state of an electric machine, the electric machine including a rotor, a stator, and a rectifier circuit connected to the stator, the processing unit configured to:

record a temporal progress of a voltage value of the electric machine;

determine an evaluation value, wherein:
the determination of the evaluation value is from a combination of a plurality of values of the recorded temporal progress of the voltage value over time; and/or
the evaluation value characterizes the recorded temporal progress of the voltage value over time;

compare the determined evaluation value to a reference value of a predefined reference constant, wherein the value of the predefined reference constant is predefined and independent of the recorded temporal progress of the voltage value; and evaluate, as a function of a comparison result of the comparison, whether or not a malfunction state of the electric machine is present;

wherein positions of local extremes are determined in the temporal progress of the voltage value as determinable recurring features, and the evaluation value is determined from the determined positions of the local extremes.

14. A non-transitory machine-readable storage medium on which is stored a computer program for detecting a malfunction state of an electric machine, the electric machine including a rotor, a stator, and a rectifier circuit connected to the stator, the computer program, when executed by a computer, causing the computer to perform the following steps:

recording a temporal progress of a voltage value of the electric machine;

determining an evaluation value, wherein:
the determination of the evaluation value is from a combination of a plurality of values of the recorded temporal progress of the voltage value over time; and/or
the evaluation value characterizes the recorded temporal progress of the voltage value over time;

comparing the determined evaluation value to a reference value of a predefined reference constant, wherein the value of the predefined reference constant is predefined and independent of the recorded temporal progress of the voltage value; and evaluating, as a function of a comparison result of the comparing, whether or not a malfunction state of the electric machine is present;

wherein positions of local extremes are determined in the temporal progress of the voltage value as determinable recurring features, and the evaluation value is determined from the determined positions of the local extremes.

* * * * *